(12) United States Patent
Yeh et al.

(10) Patent No.: US 7,871,835 B2
(45) Date of Patent: Jan. 18, 2011

(54) METHOD FOR PACKAGING LIGHT-EMITTING DIODE

(75) Inventors: Shu-Ling Yeh, Yangmei Township (TW); Ya-Lan Chuang, Lioujia Township (TW); Pei-Jung Tsai, Cingshuei Township (TW); Chih-Hsiang Lin, Taipei (TW); Hsin-Ching Kao, Baoshan Township (TW); Feng-Chih Chang, Hsinchu (TW); Tang-Jung Wu, Dali (TW)

(73) Assignees: Industrial Technology Research Institute (TW); Topco Technologies Corp. (TW)

( * ) Notice: Subject to any disclaimer, the term of this patent is extended or adjusted under 35 U.S.C. 154(b) by 134 days.

(21) Appl. No.: 12/418,552

(22) Filed: Apr. 3, 2009

(65) Prior Publication Data

US 2010/0047936 A1 Feb. 25, 2010

(30) Foreign Application Priority Data

Aug. 25, 2008 (TW) .............................. 97132383 A

(51) Int. Cl.
*H01L 21/00* (2006.01)
*H01L 21/469* (2006.01)
*H01L 21/31* (2006.01)

(52) U.S. Cl. .............................. 438/26; 438/34; 438/69; 438/99; 438/780; 257/E21.007; 257/E21.273; 257/E21.499

(58) Field of Classification Search .......... 257/E21.007, 257/E21.273, E21.499
See application file for complete search history.

(56) References Cited

U.S. PATENT DOCUMENTS

| | | | | |
|---|---|---|---|---|
| 4,931,379 | A * | 6/1990 | Brunsvold et al. | 430/270.1 |
| 7,629,272 | B2 * | 12/2009 | Waldfried et al. | 438/781 |
| 2006/0024967 | A1 * | 2/2006 | De Rege Thesauro et al. | 438/692 |
| 2009/0005513 | A1 * | 1/2009 | Liao et al. | 525/329.4 |

* cited by examiner

*Primary Examiner*—Charles D Garber
*Assistant Examiner*—Mohsen Ahmadi
(74) *Attorney, Agent, or Firm*—Lowe Hauptman Ham & Berner, LLP

(57) ABSTRACT

Disclosed is a method for packaging an LED by a thermoplastic copolymer. The copolymer is polymerized by 100 parts by weight of an acrylic ester, 0.1 to 30 parts by weight of a hydrogen bond monomer, and 0.1 to 70 parts by weight of a bulky monomer. The copolymer has transparency greater than 90%, thermal resistance greater than 130° C., and moisture absorption less than 0.5 wt %, such that the copolymer may be applied as packaging material for a light emitting device.

6 Claims, No Drawings

METHOD FOR PACKAGING LIGHT-EMITTING DIODE

CROSS REFERENCE TO RELATED APPLICATIONS

This Application claims priority of Taiwan Patent Application No. 97132383, filed on Aug. 25, 2008, the entirety of which is incorporated by reference herein.

BACKGROUND OF THE INVENTION

1. Field of the Invention

The present invention relates to a method for packaging an LED, and in particular relates to the thermoplastic material utilized in this method.

2. Description of the Related Art

Epoxy resin and silicone are the most popular materials used when packaging a light-emitting diode (LED). Considering lower costs and electrical properties, epoxy resin is applied in vehicle illumination and traffic signal LED devices, and silicone is applied in high efficiency liquid crystal displays (LCDs). The epoxy resin belongs to the family of thermosetting material, however, the packaging method utilizing epoxy resin is a time consuming infusion molding or transfer molding packaging method. In addition, the epoxy resin has poor UV resistance and climate resistance, is easily yellowed, and is not recyclable. Compared to epoxy resin, a low cost polymethylmethacrylate (PMMA) material has excellent UV and climate resistance. However, the PMMA has lower Tg (about 100° C.) than the epoxy resin (about 130° C.), the PMMA has higher moisture absorption (2.0 wt %) than the epoxy resin (0.5 wt %), and the PMMA has lower refractive index (1.49) than the epoxy resin (1.54). Accordingly, a novel thermoplastic material with mainly the advantages of both the low cost PMMA material and the epoxy resin for packaging an LED is called for.

BRIEF SUMMARY OF THE INVENTION

The invention provides a method for packaging an LED, wherein the improvement comprises, or characterized in providing an LED; and packaging the LED by a thermoplastic material, wherein the thermoplastic material is copolymerized by 100 parts by weight of an acrylic ester, 0.1 to 30 parts by weight of a hydrogen bond monomer, and 0.1 to 70 parts by weight of a bulky monomer.

A detailed description is given in the following embodiments.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a method for packaging an LED. The LED of the invention can be an organic light emitting diode (OLED), optical quality sheet, or solar panel backboard. The LED is subsequently packaged by a thermoplastic material, and the packaging method includes, but is not limited to an injection molding, infusion molding, or screw pelletizing extrusion method.

The described thermoplastic material is a terpolymer copolymerized of acrylic ester, hydrogen bond monomer, and bulky monomer. The acrylic ester has the formula as Formula 1, wherein $R_1$ is hydrogen or $C_{1-4}$ alkyl group and $R_2$ is $C_{1-4}$ alkyl group. The acrylic ester occupies the majority ratio of the terpolymer, such that the terpolymer has low cost, excellent UV and climate resistance, and is recyclable.

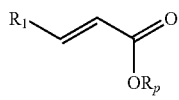

(Formula 1)

The hydrogen bond monomer has the formula as Formula 2, wherein $R_3$ is hydrogen or $C_{1-4}$ alkyl group and X is —OH or —NH$_2$. The hydrogen bond monomer of the thermoplastic material of the invention contributes terpolymer forming hydrogen bonds. The hydrogen atoms in —OH or —NH$_2$ are hydrogen bond donors, and the lone pairs on the oxygen atoms and/or the nitrogen atoms in the terpolymer are hydrogen bond acceptors. The introduction of the hydrogen bond monomer may enhance terpolymer thermal resistance such as Tg. The acrylic ester weight (100 parts) is used as a standard, and 0.1 to 30 parts by weight of the hydrogen bond monomer is used to form the terpolymer. If the amount of the hydrogen bond monomer is too high, crystallization will occur. The crystallization phenomenon from high hydrogen bond monomer amounts can be prevented by adding styrene monomer.

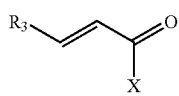

(Formula 2)

The bulky monomer can be styrene, isobornyl acrylate, isobornyl methacrylate, or the likes. The introduction of the bulky monomer may reduce the terpolymer moisture absorption. The acrylic ester weight (100 parts) is used as a standard, and 0.1 to 70 parts by weight of the bulky monomer is used to form terpolymer.

The terpolymer is bulk polymerized from an initiator. Generally, the initiator is preferably a thermal initiator, but a photo initiator may be used. The thermal initiator includes a diazo compound such as 2,2'-azobis(2,4-dimethyl valeronitrile, dimethyl 2,2'-azobis(2-methylpropionate), 2,2-azobisisobutyronitrile (AIBN), 2,2-azobis(2-methylisobutyronitrile), 1,1'-azobis(cyclohexane-1-carbonitrile), 2,2'-azobis[N-(2-propenyl)-2-methylpropionamide], 1-[(cyano-1-methylethyl)azo]formamide], 2,2'-azobis(N-butyl-2-methylpropionamide), 2,2'-azobis(N-cyclohexyl-2-methylpropionamide) or other suitable diazo compounds. The thermal initiator also includes peroxides such as benzoyl peroxide (BPO), 1,1-bis(tert-butylperoxy)cyclohexane), 2,5-bis(tert-butylperoxy)-2,5-dimethylcyclohexane, 2,5-bis(tert-butylperoxy)-2,5-dimethyl-3-cyclohexyne, bis(1-(tert-butylperoxy)-1-methy-ethyl)benzene, tert-butyl hydroperoxide, tert-butyl peroxide, tert-butyl peroxybenzoate, cumene hydroperoxide, cyclohexanone peroxide, dicumyl peroxide, lauroyl peroxide, or other suitable peroxides. The photo initiator includes acetophenones such as 2-methyl-1-(4-(methylthio)phenyl)-2-morpholino-propane, 1-hydroxycyclohexyl phenyl ketone, diethoxyacetophenone, 2-hydroxy-2-methyl-1-phenyl-propane-1-one, 2-benzyl-2-(dimethylamino)-1-[4-(morpholinyl)phenyl]-1-butanone, and other acetophenones. The photo initiator also includes benzoins such as benzoin, benzoin methyl ether, benzyl dimethyl ketal, or other suitable benzoins. The photo initiator also includes benzophenones such as benzophenone, 4-phenyl benzophenone, hydroxyl benzophenone, or other suitable benzophenone. The photoinitiator can be thioxanthone such as isopropyl thioxanthone, 2-chlorothioxanthone, or the likes, or anthraquinones such as 2-ethylanthraquinone or the likes.

After polymerization, the thermoplastic material having transparency greater than 90%, thermal resistance (glass transition temperature) greater than 130° C., and moisture absorption less than 0.5 wt % is obtained. In one embodiment, the thermoplastic material has a molecular weight between 100,000 and 250,000. If the thermoplastic material molecular weight is less than 100,000, it will have poor mechanical properties. On the other hand, if the thermoplastic material molecular weight is greater than 250,000, it will have low flowability, such that the mold cavities are not able to be filled and the thermoplastic material will fragment due to a long residence time.

Compared to the conventional epoxy resin, the LED packaged by the thermoplastic material of the invention has lower costs, shorter packaging times, and better UV/climate resistance. Additionally, the packaging material of the invention is a recyclable thermoplastic material, as compared to the conventional epoxy resin which is not the recyclable, thus, making the packaging material of the invention environmentally friendly.

EXAMPLE

Example 1

Different weight ratios of an acrylic ester such as methyl methacrylate (MMA), a hydrogen bond monomer such as methacrylamide (MAAM), a bulky monomer such as isobornyl methacrylate (IBMA), and a first stage thermoinitiator such as benzoyl peroxide (I-BPO) were reacted at 60 to 80° C. for 1 to 3 hours. After the viscosity of the reaction was enhanced, a second stage thermoinitiator BPO (II-BPO) was added, and the reaction temperature was then reduced to 40 to 60° C. for 0.5 to 3 hours. Finally, the resulting mixture was charged in an oven to react at 90° C. for 2 hours and at 130° C. for 2 hours to complete block polymerization. The reactant weight ratio and corresponding product Tg were measured and tabulated as in Table 1.

TABLE 1

|  | 01 | 02 | 03 | 04 | 05 | 06 | 07 |
|---|---|---|---|---|---|---|---|
| MMA | 94% | 92% | 90% | 70% | 74% | 64% | 54% |
| MAAM | 6% | 8% | 10% | 0 | 6% | 6% | 6% |
| IBMA | 0 | 0 | 0 | 30% | 20% | 30% | 40% |
| I-BPO |  |  |  | 0.75% |  |  |  |
| II-BPO |  |  |  | 0.045% |  |  |  |
| Tg (° C.) | 133.41 | 133.58 | 139.60 | 127.88 | 151.32 | 142.85 | 160.38 |

In Table 1, the experiments No. 1-3 showed that a higher hydrogen bond monomer ratio may improve the thermal resistance (Tg) of the copolymer. Also, the experiments showed that when the hydrogen bond monomer ratio was fixed, introduction of a bulky monomer such as IBMA may further enhance the thermal resistance of the copolymer as well as reduce the copolymer moisture absorption to 0.35 wt %.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for packaging an LED, wherein the improvement comprises, or characterized in:

providing an LED; and packaging the LED by a thermoplastic material, wherein the thermoplastic material is copolymerized by 100 parts by weight of an acrylic ester, 0.1 to 30 parts by weight of a hydrogen bond monomer, and 0.1 to 70 parts by weight of a bulky monomer.

2. The method as claimed in claim 1, wherein the thermoplastic material has a molecular weight of 100000 to 250000.

3. The method as claimed in claim 1, wherein the acrylic ester has the following formula:

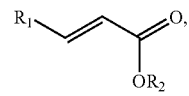

wherein $R_1$ is hydrogen or $C_{1-4}$ alkyl group, and $R_2$ is $C_{1-4}$ alkyl group.

4. The method as claimed in claim 1, wherein the hydrogen bond monomer has the following formula:

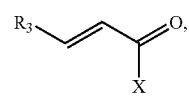

wherein $R_3$ is hydrogen or $C_{1-4}$ alkyl group, and X is —OH or —NH$_2$.

5. The method as claimed in claim 1, wherein the bulky monomer comprises styrene, isobornyl acrylate, or isobornyl methacrylate.

6. The method as claimed in claim 1, wherein the method for packaging the LED by a thermoplastic material comprises an injection molding, infusion molding, or screw pelletizing extrusion method.

* * * * *